United States Patent
Aadsen et al.

(10) Patent No.: US 7,363,424 B2
(45) Date of Patent: Apr. 22, 2008

(54) CONTENT ADDRESSABLE MEMORIES (CAMS) BASED ON A BINARY CAM AND HAVING AT LEAST THREE STATES

(75) Inventors: Duane Rodney Aadsen, Bath, PA (US); Dennis E. Dudeck, Hazleton, PA (US); Donald A. Evans, Lancaster, OH (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/619,889

(22) Filed: Jan. 4, 2007

(65) Prior Publication Data

US 2007/0103953 A1    May 10, 2007

Related U.S. Application Data

(63) Continuation of application No. 10/744,798, filed on Dec. 23, 2003, now Pat. No. 7,191,280.

(51) Int. Cl.
*G06F 12/00* (2006.01)
(52) U.S. Cl. .................................................. 711/108
(58) Field of Classification Search ............... 711/108; 365/49
See application file for complete search history.

(56) References Cited

U.S. PATENT DOCUMENTS

| | | | |
|---|---|---|---|
| 6,362,992 B1 * | 3/2002 | Cheng | 365/49 |
| 6,707,692 B2 | 3/2004 | Hata et al. | |
| 2003/0081442 A1 | 5/2003 | Tsuda et al. | |
| 2004/0032758 A1 | 2/2004 | Cheng et al. | |
| 2004/0109338 A1 | 6/2004 | Jeung | |

* cited by examiner

*Primary Examiner*—Hiep T. Nguyen

(57) ABSTRACT

Content addressable memories are disclosed that provide at least three states and are based on existing binary CAM devices. A higher order CAM having at least three states comprises a binary CAM having two binary bits; and a logic circuit to configure the two binary bits as a single CAM bit having said at least three states. The three states include a don't care state, a logic 0 state and a logic 1 state. The logic circuit may be embodied as two OR gates. The first match search (MS) input and a first wild card (WC) input of the higher order CAM are applied to inputs of the two OR gates and the outputs of the two OR gates are applied to the wild card (WC) inputs of the binary CAM. The match search (MS) inputs of the binary CAM are tied to a power supply voltage.

16 Claims, 3 Drawing Sheets

FIG. 1
PRIOR ART
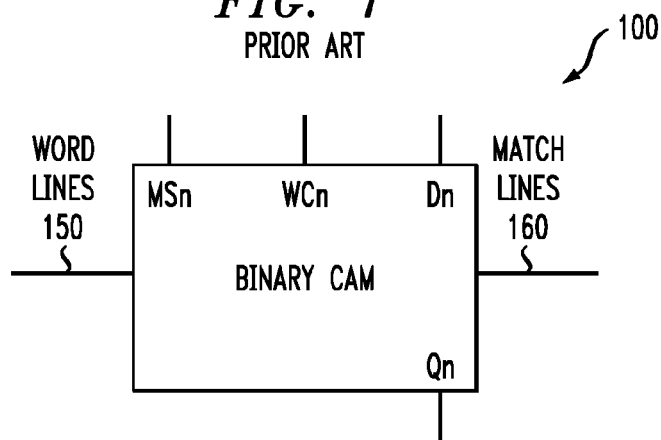
FIG. 2
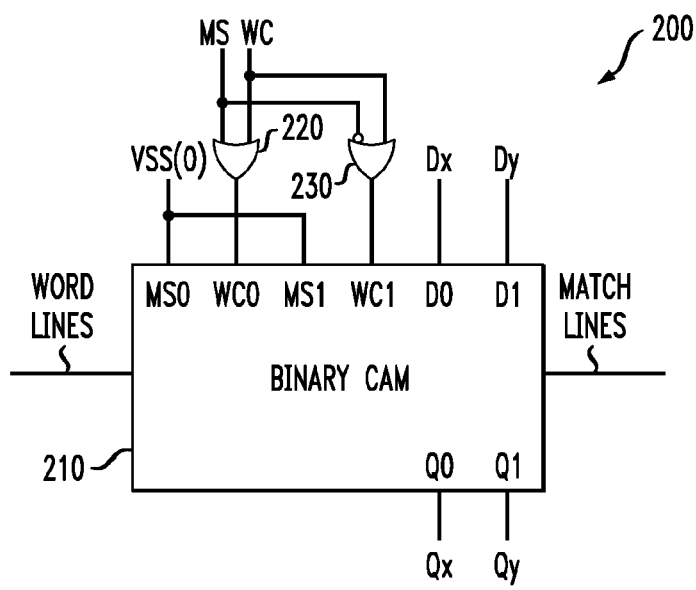
FIG. 3
| x | y | LOGIC |
|---|---|---|
| 0 | 0 | "DON'T CARE" |
| 0 | 1 | 0 |
| 1 | 0 | 1 |
| 1 | 1 | "DON'T MATCH" |

CONTENT ADDRESSABLE MEMORIES (CAMS) BASED ON A BINARY CAM AND HAVING AT LEAST THREE STATES

CROSS-REFERENCE TO RELATED APPLICATION

The present application is a continuation application under 37 CFR § 153(b) of U.S. application Ser. No. 10/744,798, filed Dec. 23, 2003 now U.S. Pat. No. 7,191,280 and incorporated by reference herein.

FIELD OF THE INVENTION

The present invention relates generally to content addressable memories (CAMs), and more particularly, to CAMs based on a binary CAM and having bits with at least three states.

BACKGROUND OF THE INVENTION

Content addressable memories, often referred to as associative memories, have memory locations that are identified by the contents of the location or a portion thereof. A CAM can be written to and read from like a traditional memory array, and can also be searched to identify one or more address locations that store a desired value Generally, when in a search mode, a CAM will return an address containing a given search string (data pattern). A binary CAM is capable of storing information in two different logic states, namely, a binary "0" state or a binary "1" state. A ternary CAM cell provides a "don't care" logic state, in addition to the binary "0" and binary "1" states.

Binary and ternary CAM cells are typically implemented using static random access memory (SRAM), dynamic RAM (DRAM), or non-volatile memory technologies. CAM cells based on SRAM technology have become increasingly popular, at least in part due to their relatively fast times for performing write and search operations.

Increasingly, there is a need for three or four state CAMs that provide at least three states (logic 0, logic 1, and a don't care state) A further need exists for a hybrid CAM that includes at least one binary CAM bit and at least one higher order CAM bit, such as a ternary CAM bit. Yet another need exists for a three or four state CAM that uses existing binary CAMs without modifying the underlying binary CAM.

SUMMARY OF THE INVENTION

Content addressable memories are disclosed that provide at least three states and are based on existing binary CAM devices. A higher order CAM having at least three states comprises a binary CAM having two binary bits; and a logic circuit to configure the two binary bits as a single CAM bit having said at least three states. The three states include a don't care state, a logic 0 state and a logic 1 state.

In one implementation, the logic circuit may be embodied as two OR gates. The first match search (MS) input and a first wild card (WC) input of the higher order CAM are applied to inputs of the two OR gates and the outputs of the two OR gates are applied to the wild card inputs of the binary CAM. The match search inputs of the binary CAM are tied to a power supply voltage A more complete understanding of the present invention, as well as further features and advantages of the present invention, will be obtained by reference to the following detailed description and drawings.

BRIEF DESCRIPTION OF THE DRAWINGS

FIG. 1 is a schematic block diagram of one column of a conventional binary CAM;

FIG. 2 is a schematic block diagram of one column of an exemplary ternary CAM incorporating features of the present invention;

FIG. 3 is a state table corresponding to the ternary CAM of FIG. 2;

DETAILED DESCRIPTION

Figures 4, 5:
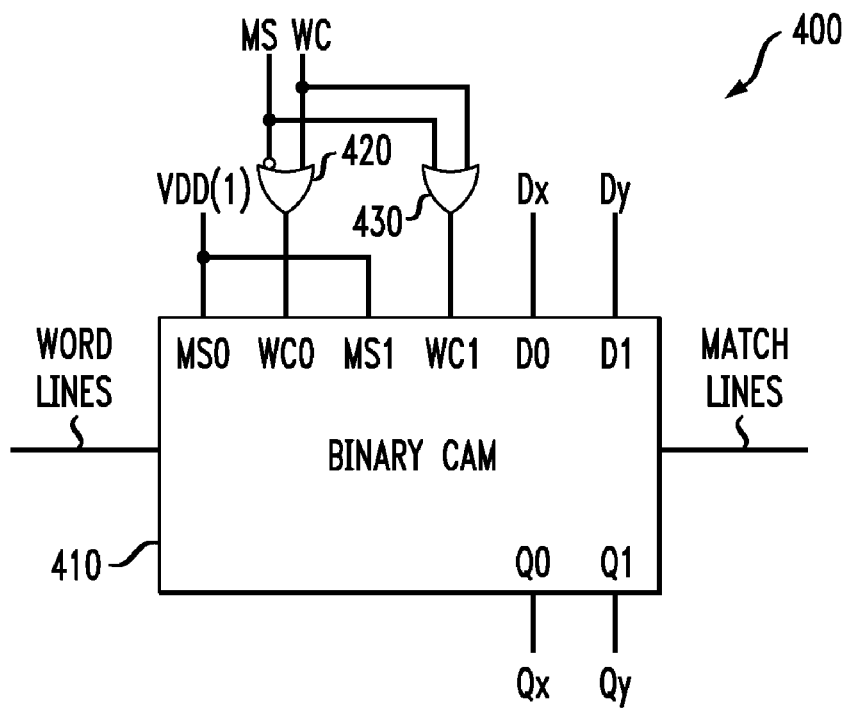
FIG. 4 is a schematic block diagram of one column of an alternate ternary CAM incorporating features of the present invention.
FIG. 5 is a state table corresponding to the ternary CAM of FIG. 4.

FIG. 1 is a schematic block diagram of a column from a conventional binary CAM 100. Typically, a binary CAM 100 is comprised of an array of CAM cells (not shown) where each row of the CAM array corresponds to a stored word. Each column is generally associated with a given bit. As shown in FIG. 1, each row of the array has an associated word line 150 that allows the tow to be accessed (for a read or write operation) by activating the appropriate word line In a write operation, data would be placed on a data line Dn for a given column. In a read operation, the binary CAM 100 places a data value on the output line Qn for a given column.

In addition, each row has an associated match line 160 that is activated when the word stored in the corresponding tow matches an applied input value during a search mode. Generally, the binary CAM 100 has match search inputs (MSn) and wild card inputs (WCn) for each column that allow the binary CAM 100 to be searched for words having an exact matching pattern or to search a subset of the bits using a mask, respectively. The wild card inputs are used to mask out corresponding bits in the match search string. For example, if a given bit in the wild card string is high, then the corresponding bit will not be compared. Typically, the binary CAM 100 has a priority encoder (not shown) that processes the match lines 160 and determines the first address in the binary CAM 100 that matches the search string.

According to one aspect of the invention, a three or four state CAM, referred to herein as a higher order CAM, is achieved that uses existing binary CAMs without modifying the underlying binary CAM. FIG. 2 is a schematic block diagram of a column of an exemplary ternary CAM 200 incorporating features of the present invention. As shown in FIG. 2, each column of the ternary CAM 200 comprises two columns (bits) of the binary CAM 100 shown in FIG. 1. It is noted that the binary CAM 210 may be embodied as any commercially available binary CAM that allows each bit in a given word to be selectively searched (i.e., provide per-bit wild cards).

Generally, the ternary CAM 200 configures two bits of a binary CAM 210 to be a single ternary CAM bit with three or four states. Thus, the ternary CAM 200 has MS and WC inputs for the single ternary bit. A state table 300 for the ternary or four state CAM 200 is discussed further below in conjunction with FIG. 3. As shown in FIG. 2, the match search and wild card values for the ternary bit are applied through two OR gates 220, 230 to the WC0 and WC1 inputs of the binary CAM 210. In addition, in the implementation shown in FIG. 2, the MS inputs of the binary CAM 210 are maintained at logic "0" (for example, by tying the MS inputs to V$_{SS}$) and the MS input to the second OR gate 230 is inverted.

FIG. 3 is a state table 300 corresponding to the ternary CAM 200 of FIG. 2. As previously indicated, the ternary CAM 200 configures two bits of a binary CAM 210 to be a single ternary CAM bit with up to four states (logic "1", "0", "don't care" and "don't match"). It is noted that the "don't match" logic value is generally considered an invalid state for a ternary (three state) device.

As shown in FIG. 3, where the MS inputs of the binary CAM 210 are maintained at logic "0", in order to: (i) write a "don't care" logic value, a 0 must be written to the x column (D0) and a 0 must be written to the y column (D1); (ii) write a "0" logic value, a 0 must be written to the x column (D0) and a 1 must be written to the y column (D1); and (iii) write a "1" logic value, a 1 must be written to the x column (D0) and a 0 must be written to the y column (D1).

Similarly, in a search mode, if it is desired to search for a logic "0", a match should occur if there is a logic "0" or a "don't care" state. Since the "don't care" state is defined as values of 0 in both the x and y columns for the embodiment of FIG. 2, the x column of the CAM 200 should be searched for x columns (WC0) having a value of 0 (which will return either a logic "0" or a "don't care" state). If it is desired to search for a logic "1", a match should occur if there is a logic "1" or a "don't care" state. Thus, the y column of the CAM 200 should be searched for y columns (WC1) having a value of 0 (which will return either a logic "1" of a "don't care" state). Generally, since the MS inputs of the binary CAM 210 are maintained at logic "0" for the embodiment of FIG. 2, and thus define the "don't care" condition as "00", the CAM 200 is always searched for values of 0 in the appropriate column (x column for logic 0 and y column for logic 1).

As previously indicated, the match search and wild card values for the ternary bit are applied through two OR gates 220, 230 to the WC0 and WC1 inputs of the binary CAM 210, where the MS input to the second OR gate 230 is inverted Generally, the OR gates 220, 230, together with the inverted input the second OR gate 230, provide a column selection mechanism that defines whether column x or column y is searched for a value of 0. The output of the OR gate 220 or 230 that has a value of 0 will indicate the respective column to be searched (and the column associated with the OR gate 220 or 230 that has a value of 1 will not be searched) For example, as indicated above, if it is desired to search for a logic "1", the y column of the CAM 200 should be searched for values of 0. This is implemented in the CAM 200 of FIG. 2 by configuring the MS and WC inputs to the ternary CAM 200 to be logic 1 and logic 0, respectively, to ensure that a value of 0 appears at the output of only the OR gate 230.

FIG. 4 is a schematic block diagram of an alternative implementation of a column of a ternary CAM 400 incorporating features of the present invention. As shown in FIG. 4, each column of the ternary CAM 400 comprises two columns (bits) of the binary CAM 100 shown in FIG. 1. FIG. 5 is a state table 500 corresponding to the ternary CAM 400 of FIG. 4. As shown in FIG. 4, the match search and wild card values for the ternary bit are applied through two OR gates 420, 430 to the WC inputs of the binary CAM 410. In addition, in the implementation of FIG. 4, the MS inputs of the binary CAM 410 ale maintained at logic "1" (for example, by tying the MS inputs to V$_{DD}$) and the MS input to the first OR gate 420 is inverted. The ternary CAM 400 is written and searched in a similar manner to the ternary CAM 200 of FIG. 2, using the logic table defined in FIG. 5.

Figure 6:
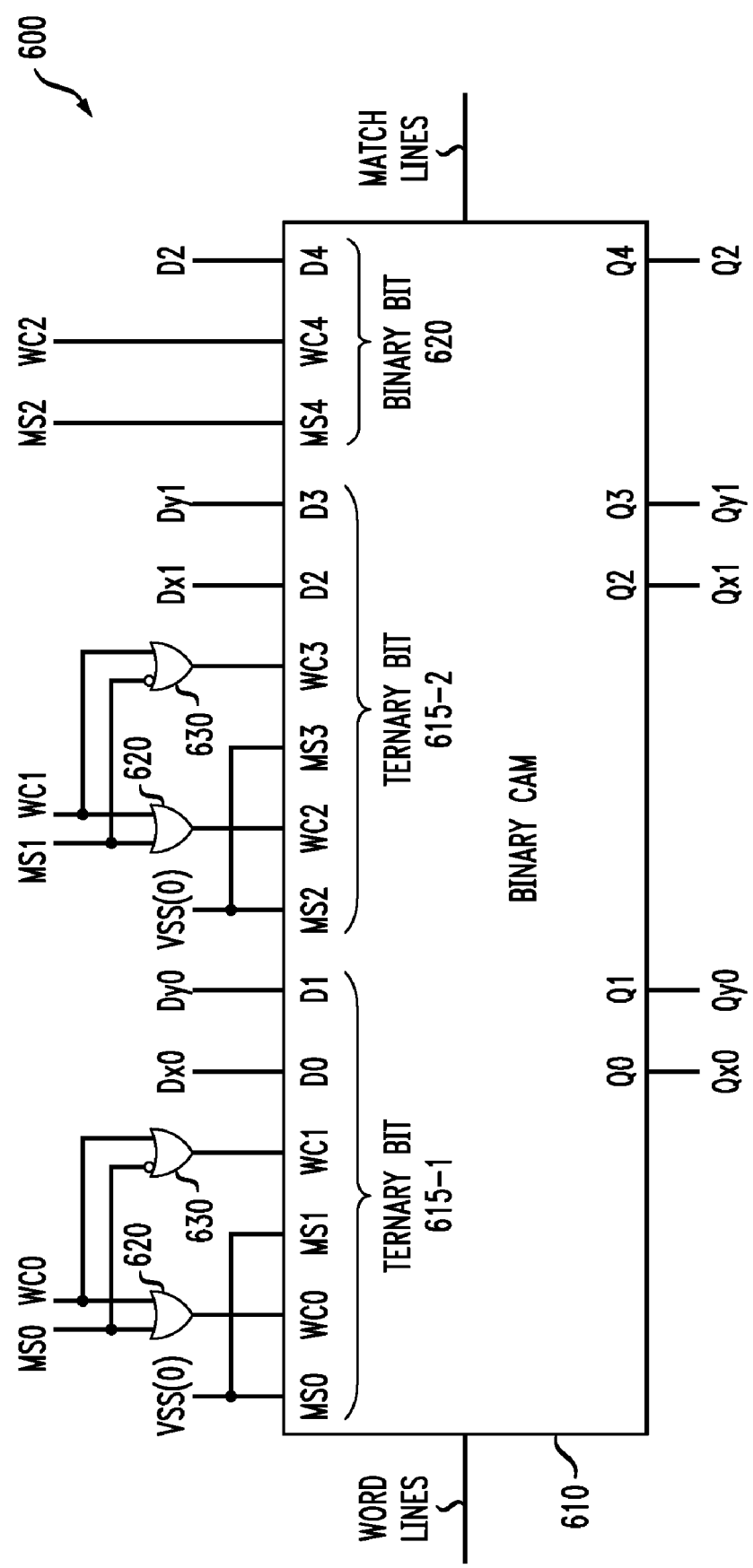
FIG. 6 is a schematic block diagram of an exemplary hybrid CAM incorporating features of the present invention.

FIG. 6 is a schematic block diagram of a hybrid CAM 600 that configures a binary CAM 610 to operate as a binary, ternary or four state CAM As shown in FIG. 6, the exemplary hybrid CAM 600 comprises a binary CAM 610, such as the binary CAM 100 shown in FIG. 1, where two columns of the binary CAM 610 form a first ternary bit 615-1, two columns of the binary CAM 610 form a second ternary bit 615-2 and one column of the binary CAM 610 form a binary bit 620. In this manner, if a given implementation requires ternary functionality, the ternary bits 615 may be employed as needed and if a given implementation does not require any ternary functionality, only binary bits 620 may be employed.

As shown in FIG. 6, each ternary bit 615 has an associated match search value and wild card value that are applied through two OR gates 620, 630 to the WC inputs of the corresponding binary CAM 610, in a similar manner to FIG. 2. In the implementation of FIG. 6, the MS inputs of the binary CAMs 610 are maintained at logic "0" (for example, by tying the MS inputs to V$_{SS}$) and the MS input to the second OR gate 630 is inverted. It is noted that an alternate hybrid CAM 600 can be implemented using the ternary CAMs of FIG. 4, where 6, the MS inputs of the binary CAMs 610 are maintained at logic "1" (for example, by tying the MS inputs to V$_{DD}$) and the MS input to the first OR gate 620 is inverted, or a combination of the embodiments shown in FIGS. 2 and 4 in a single hybrid CAM 600.

It is to be understood that the embodiments and variations shown and described herein are merely illustrative of the principles of this invention and that various modifications may be implemented by those skilled in the art without departing from the scope and spirit of the invention

We claim:

1. A content addressable memory (CAM) having at least three states, comprising:
    an integrated circuit comprising a binary CAM, said binary CAM having two binary bits; and
    a logic circuit located external to said integrated circuit, wherein said logic circuit configures said two binary bits to perform as a single CAM bit having said at least three states.

2. The content addressable memory of claim 1, wherein said logic circuit further comprises outputs that are capable of driving inputs of said integrated circuit.

3. The content addressable memory of claim 1, wherein said at least three states include a don't care state, a logic 0 state and a logic 1 state.

4. The content addressable memory of claim 1, wherein said logic circuit comprises at least two OR gates and said CAM has a first match search (MS) input and a first wild card (WC) input, wherein said first match search (MS) input and said first wild card (WC) input are applied to inputs of said at least two OR gates and outputs of said at least two OR gates are applied to at least two binary wild card (WC) inputs of said binary CAM.

5. The content addressable memory of claim 4, wherein an input to one of said pair of OR gates is inverted.

6. A method of fabricating a content addressable memory (CAM) having at least three states, comprising the steps of:
    fabricating a logic circuit; and
    connecting said logic circuit to terminals on an integrated circuit, wherein said logic circuit is located external to said integrated circuit, wherein said integrated circuit comprises a binary CAM having two binary bits, and wherein said logic circuit configures said two binary bits to per form as a single CAM bit having said at least three states.

7. The method of claim 6, wherein said fabricating step is performed substantially simultaneously with said connecting step.

8. The method of claim 6, wherein said fabricating step is performed prior to said connecting step.

9. The method of claim 8, wherein said logic circuit comprises at least two OR gates and said CAM has a first match search (MS) input and a first wild card (WC) input, wherein said first match search (MS) input and said first wild card (WC) input are applied to inputs of said at least two OR gates and outputs of said at least two OR gates are applied to at least two binary wild card (WC) inputs of said binary CAM.

10. The method of claim 9, further comprising the step of inverting an input to one of said pair of OR gates.

11. A hybrid content addressable memory (CAM), comprising:
an integrated circuit comprising a binary CAM, said binary CAM having a plurality of columns; and
at least one logic circuit located external to said integrated circuit, wherein each logic circuit is associated with two of said columns to configure said two associated columns to perform as a single bit having at least three states.

12. The hybrid CAM of claim 11, wherein said at least thee states include a don't care state, a logic 0 state and a logic 1 state.

13. The hybrid CAM of claim 11, wherein said single bit is a ternary bit having three states.

14. The hybrid CAM of claim 11, wherein said single bit is a bit having four states.

15. The hybrid CAM of claim 11, wherein at least one of said columns is configured as a binary bit.

16. The hybrid CAM of claim 11, wherein said at least one logic circuit comprises at least two OR gates and said CAM has a first match search (MS) input and a first wild card (WC) input, wherein said first match search (MS) input and said first wild card (WC) input are applied to inputs of said at least two OR gates and outputs of said at least two OR gates are applied to at least two binary wild card (WC) inputs of said binary CAM.

* * * * *

UNITED STATES PATENT AND TRADEMARK OFFICE
CERTIFICATE OF CORRECTION

PATENT NO. : 7,363,424 B2  
APPLICATION NO. : 11/619889  
DATED : April 22, 2008  
INVENTOR(S) : Aadsen et al.

Page 1 of 1

It is certified that error appears in the above-identified patent and that said Letters Patent is hereby corrected as shown below:

Column 1, line 9, after "37 CFR" and before "of" replace "§ 153(b)" with --§1.53(b)--.

Column 2, line 26, after "allows" and before "to be" replace "the tow" with --the row--; line 33, before "matches" replace "tow" with --row--.

Column 3, line 64, after "410" and before "maintained" replace "ale" with --are--.

In claim 6, column 5, line 2, after "to" and before "as" replace "per form" with --perform--.

Signed and Sealed this

Fourteenth Day of October, 2008

JON W. DUDAS  
*Director of the United States Patent and Trademark Office*